(12) United States Patent
Zeta et al.

(10) Patent No.: US 8,552,566 B1
(45) Date of Patent: Oct. 8, 2013

(54) INTEGRATED CIRCUIT PACKAGE HAVING SURFACE-MOUNT BLOCKING ELEMENTS

(75) Inventors: Ruben C. Zeta, Milpitas, CA (US); Edgardo L. Chua Ching Chua, Paranaque (PH)

(73) Assignee: Maxim Integrated Products, Inc., San Jose, CA (US)

( * ) Notice: Subject to any disclaimer, the term of this patent is extended or adjusted under 35 U.S.C. 154(b) by 249 days.

(21) Appl. No.: 12/156,290

(22) Filed: May 30, 2008

(51) Int. Cl.
  *H01L 23/48* (2006.01)
(52) U.S. Cl.
  USPC .......................................... 257/777; 257/686
(58) Field of Classification Search
  USPC .................................. 257/686, 777
  See application file for complete search history.

(56) References Cited

U.S. PATENT DOCUMENTS

| | | | |
|---|---|---|---|
| 5,861,662 A | 1/1999 | Candelore | 257/679 |
| 6,646,565 B1 | 11/2003 | Fu et al. | 340/687 |
| 6,657,314 B2 * | 12/2003 | Pockrandt | 257/698 |
| 7,054,162 B2 | 5/2006 | Benson et al. | 361/760 |
| 7,065,656 B2 | 6/2006 | Schwenck et al. | 713/194 |
| 7,898,090 B1 * | 3/2011 | Eaton | 257/777 |
| 2001/0033012 A1 | 10/2001 | Kommerling et al. | 257/679 |
| 2005/0082680 A1 * | 4/2005 | Liu et al. | 257/777 |
| 2006/0086534 A1 | 4/2006 | Oggioni et al. | 174/261 |
| 2006/0087883 A1 | 4/2006 | Ozguz et al. | 365/185.04 |
| 2006/0170091 A1 | 8/2006 | Karnezos | 257/686 |
| 2006/0231633 A1 | 10/2006 | Farooq et al. | 235/492 |
| 2007/0018334 A1 | 1/2007 | Peytavy et al. | 257/778 |
| 2007/0038865 A1 | 2/2007 | Oggioni et al. | 713/178 |
| 2007/0170572 A1 * | 7/2007 | Liu et al. | 257/686 |

OTHER PUBLICATIONS

Web pages from www.amkor.com, 18 pages (downloaded and printed out Apr. 30, 2007).

* cited by examiner

*Primary Examiner* — Marcos D. Pizarro
*Assistant Examiner* — Tifney Skyles
(74) *Attorney, Agent, or Firm* — North Weber & Baugh LLP

(57) ABSTRACT

A first cavity-down ball grid array (BGA) package includes a substrate member and an array of bond balls. The array of bond balls includes a pair of parallel extending rows of outer mesh bond balls and a row of inner signal bond balls that is parallel to the pair of rows of outer mesh bond balls. A surface-mount blocking element is disposed between the row of inner signal bond balls and the pair of rows of outer mesh bond balls. The surface-mount blocking element is either a passive or an active component of the BGA package. In one example, the first cavity-down BGA package is surface-mounted to a second cavity-down BGA package to form a package-on-package (POP) security module. The surface-mount blocking element provides additional physical barrier against the probing of the inner signal bond balls. Sensitive data is therefore protected from unauthorized access.

20 Claims, 8 Drawing Sheets

CROSS-SECTIONAL VIEW OF POP SECURITY MODULE 20

CROSS-SECTIONAL VIEW OF POP SECURITY MODULE 20

EXPENDED VIEW OF BLOCK 70 OF FIG. 4

DIAGRAM TAKEN ALONG CROSS-SECTIONAL LINE A-A OF FIG. 3

FIRST BGA PACKAGE 21

SECOND BGA PACKAGE 41

SECOND BGA PACKAGE WITH SURFACE-MOUNT BLOCKING ELEMENT

SECOND BGA PACKAGE WITH SURFACE-MOUNT
BLOCKING ELEMENT AND ARRAY OF BOND BALLS

PACKAGE-ON-PACKAGE (POP)
SECURITY MODULE

US 8,552,566 B1

INTEGRATED CIRCUIT PACKAGE HAVING SURFACE-MOUNT BLOCKING ELEMENTS

TECHNICAL FIELD

The disclosed embodiments relate to securing electronic components and data, and more specifically, to integrated circuit packages having surface-mount blocking elements that protect against unauthorized access to the electronic components.

BACKGROUND

Integrated Circuits (ICs) are commonly packaged in surface-mount package types such as a Ball Grid Array (BGA) package. A BGA package is a surface-mount package that utilizes an array of bond balls as the means of providing external electrical interconnection. When such BGA package is used in financial transactions, a thief or hacker may be able to physically penetrate electronic components and gain access to processors, memory devices, and address/data busses that are used to communicate and process sensitive data including passwords, account numbers, pin numbers, access codes, and other information.

To prevent sensitive data from being accessed in an unauthorized manner, various security modules and containers have been developed to enclose a circuit to be protected. A tamper detection circuit within the container is typically connected to a security layer to detect circuit tampering. Once a tamper condition has been detected, sensitive information stored in the circuit is quickly erased before it can be read by the possible attacker. Examples of such security modules are described in U.S. Patent Application Publication. No. 2007/0018334, and in U.S. Patent Application Publication No. 2007/0038865.

FIG. 1 (Prior Art) illustrates a cross-sectional view of a BGA package 1. BGA package 1 includes a substrate member 2 having an anti-tamper security mesh layer 3, an integrated circuit die 4, and an array of bond balls. Six of the bond balls 5-10 are illustrated in the cross-sectional view. Bond balls 5-6 and 9-10 are outer mesh bond balls coupled to anti-tamper security mesh 3, and bond balls 7-8 are inner signal bond balls used for data communication and processing.

FIG. 2 (Prior Art) is a diagram taken along cross-sectional line A-A of FIG. 1. As illustrated in FIG. 2, two rows of outer mesh bond balls are used to prevent possible unauthorized access to one row of inner signal bond balls. However, a thief or hacker may still be able to access the inner signal bond balls by using a thin magnet wire without triggering a tamper condition. Therefore, it is beneficial to make it more difficult for possible attackers to access the inner signal bond balls. It is especially desirable to secure access to the inner signal bond balls designated for security sensitive data transactions.

SUMMARY

A first cavity-down ball grid array (BGA) package includes a substrate member and an array of bond balls. The array of bond balls includes a pair of parallel extending rows of outer mesh bond balls and a row of inner signal bond balls that is parallel to the pair of rows of outer mesh bond balls. Each of the bond balls has a diameter, and the distance between the row of inner signal bond balls and the pair of rows of outer mesh bond balls is less than five times the diameter of the bond balls. A surface-mount blocking element is disposed between the row of inner signal bond balls and the pair of rows of outer mesh bond balls. The surface-mount blocking element is either a passive or an active discrete component such as a resistor or a capacitor of the BGA package. The surface-mount blocking element provides additional physical barrier against the probing of the inner signal bond balls from side edges of the BGA package. The surface-mount blocking element has a length that is longer than the diameter of the bond balls and provides a better physical barrier as compared to a mesh bond ball. Sensitive data is therefore protected from unauthorized access.

In one embodiment, the first cavity-down BGA package is surface-mounted to a substrate member of a second cavity-down BGA package to form a package-on-package (POP) security module. The surface-mount blocking element is also surface-mounted to the substrate member of the second BGA package. In one example, an anti-tamper security mesh layer of conductors is embedded in the substrate member of the first BGA package. A conductor of the anti-tamper security mesh is coupled to an integrated circuit of the first BGA package through one of the outer mesh bond balls. The integrated circuit of the first BGA package communicates security data to an integrated circuit of the second BGA package through one of the inner signal bond balls.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
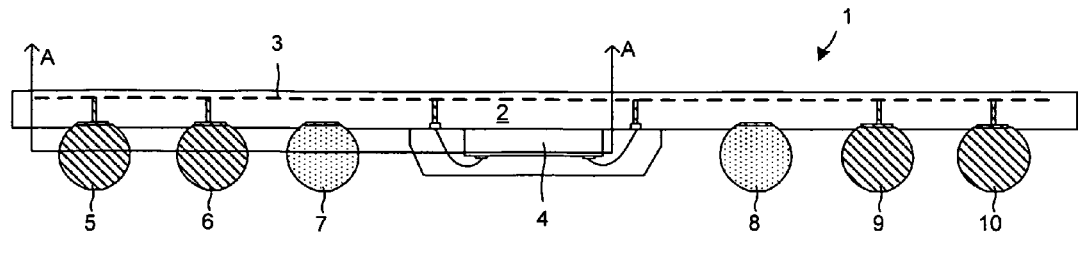
FIG. 1 (Prior Art) is a simplified cross-sectional view of a Ball Grid Array (BGA) package 1.
Figure 2:
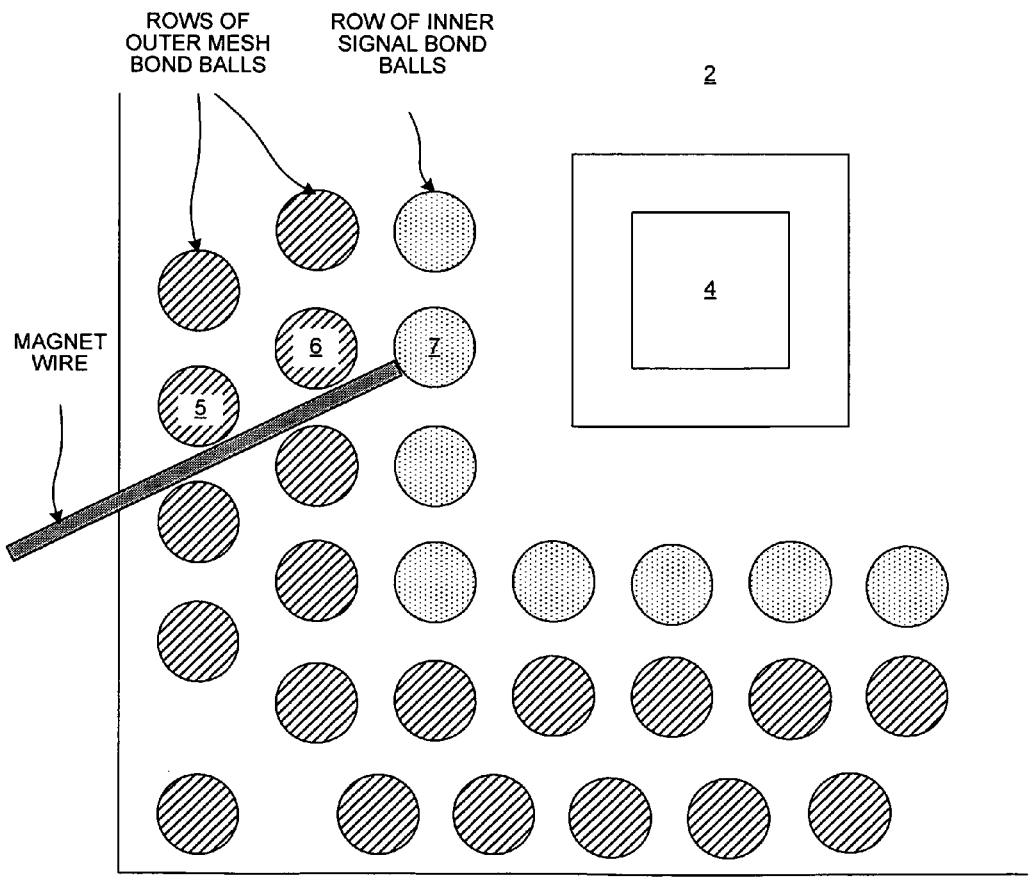
FIG. 2 (Prior Art) is a diagram taken along cross-sectional line A-A of FIG. 1.
Figure 3:
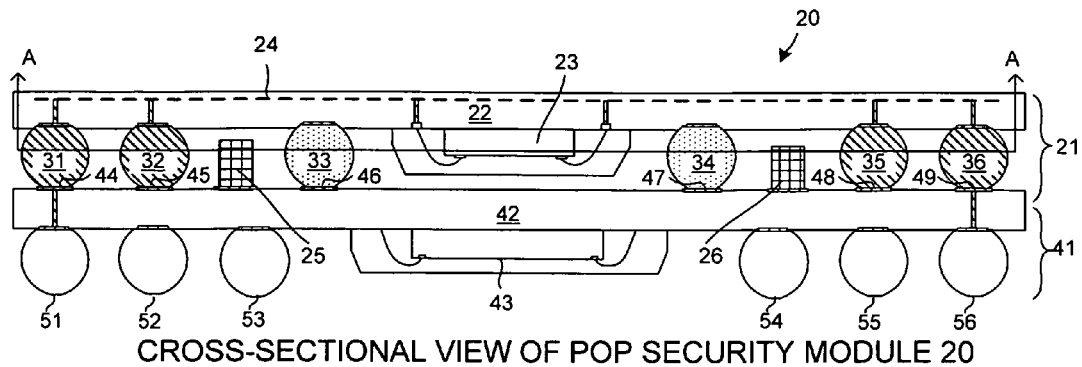
FIG. 3 is a simplified cross-sectional view of a Package-on-Package (POP) security module 20 in accordance with one novel aspect.

FIG. 3 is a simplified cross-sectional view of a Package-on-Package (POP) security module 20 in accordance with one novel aspect. POP security module 20 includes a top Ball Grid Array (BGA) package 21 and a bottom BGA package 41. Top BGA package 21 includes a substrate member 22, an integrated circuit die 23 and an array of bond balls. Six of the bond balls 31-36 are illustrated in the cross-sectional view. Integrated circuit die 23 is connected by wire bonds to a lower surface of substrate member 22. Bond balls 31-36 are also disposed to the lower surface of substrate member 22. An anti-tamper security mesh 24 is embedded within substrate member 22. Bottom BGA package 41 includes a substrate member 42, an integrated circuit die 43, an array of lands, an array of bond balls, and surface-mount blocking elements 25-26. Six of the lands 44-49 and six of the bond balls 51-56 are illustrated in the cross-sectional view. Integrated circuit die 43 is connected by wire bonds to a lower surface of substrate member 42. Bond balls 51-56 are also disposed to the lower surface of substrate member 42. Surface-mount blocking elements 25-26 are attached to an upper surface of substrate member 42. Bond balls 31-36 of top BGA package 21 register with and are fixed to corresponding ones of the lands 44-49 on the upper surface of substrate member 42 of bottom BGA package 41. Top BGA package 21 is therefore piggy-back mounted to bottom BGA package 41 so that BGA package 21 and BGA package 41 together form POP security module 20.

As illustrate in FIG. 3, bond balls 31-32, 35-36 and 51, 56 are outer mesh bond balls coupled to anti-tamper security mesh 24. Bond balls 33-34 are inner signal bond balls used to conduct signals for data communication and processing. Anti-tamper security mesh 24 is made to cup down around the side edges of POP security module 20. In one example, the conductors of mesh 24 are made to meander vertically up and down through the outer mesh bond balls of top BGA package 21 and bottom BGA package 41 so as to form a picket fence like security structure that surrounds the integrated circuit 23 and 43. The picket fence like security structure helps protect against probing of POP secure module 20 from the side. For additional details on picket fence like security structure, see: U.S. patent application Ser. No. 11/786,871 entitled "Package-on-Package Secure Module Having Anti-Tamper Mesh In the substrate of the Upper Package", filed Apr. 13, 2007, by Steven M. Pope et al. (the subject matter of which is incorporated herein by reference). As described in further detail below, the existence of the outer mesh bond balls and the surface-mount blocking elements makes it much more difficult for possible attackers to probe the inner signal bond balls and thus protect sensitive information from being accessed.

Figure 4A:
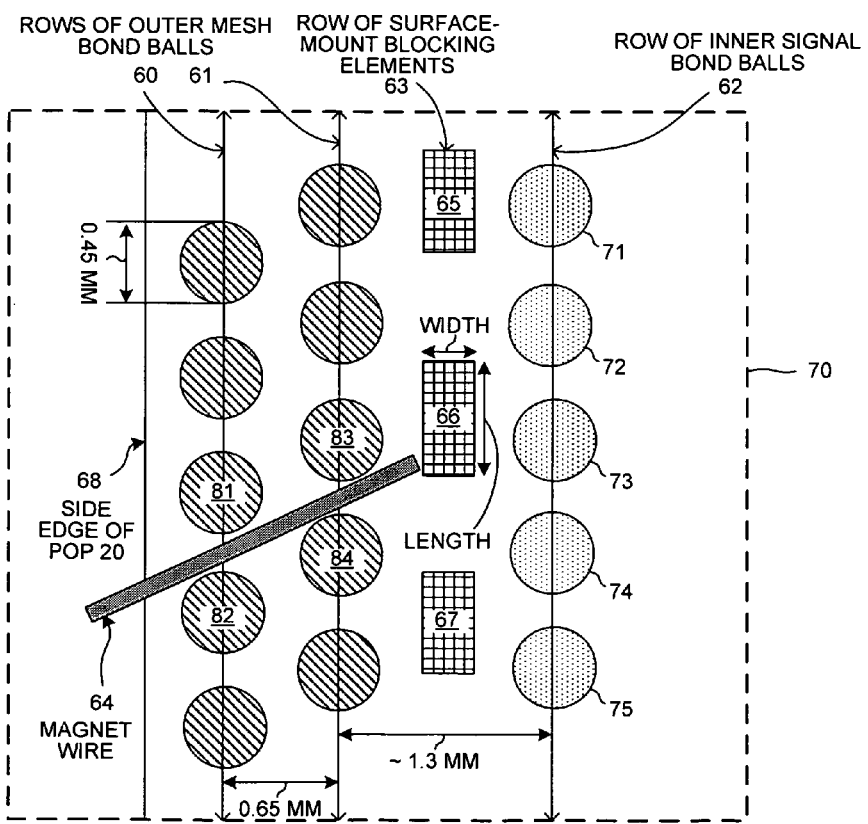
FIG. 4A is an expanded view of a portion of the diagram of FIG. 4.
Figure 4:
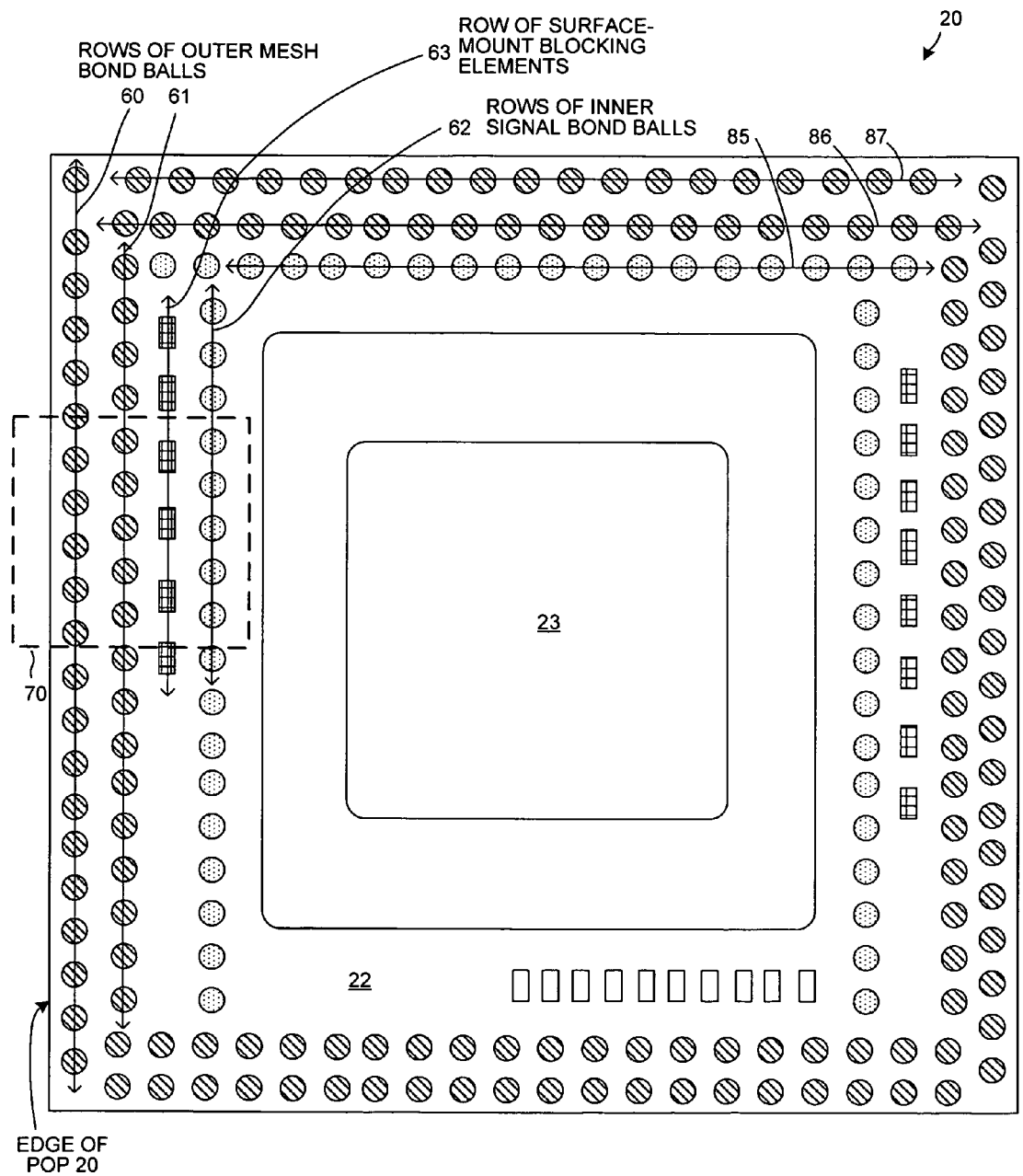
FIG. 4 is a diagram taken along cross-sectional line A-A of FIG. 3.

FIG. 4 is a cross-sectional diagram taken along cross-sectional line A-A of FIG. 3. As illustrated in FIG. 4, POP security module 20 includes a pair of parallel extending rows 60-61 of outer mesh bond balls, a row 62 of inner signal bond balls, and a row 63 of surface-mount blocking elements. Row 62 of inner signal bond balls and row 63 of surface-mount blocking elements are also parallel to rows 60-61 of outer mesh bond balls. Row 63 of surface-mount blocking elements is located between rows 60-61 of outer mesh bond balls and row 62 of inner signal bond balls.

FIG. 4A is an expanded diagram of a portion 70 of FIG. 4. In the example of FIG. 4A, each one of the bond balls has a diameter of approximately 0.45 millimeters and is approximately 0.65 millimeters apart from each other. Row 60 and row 61 of outer mesh bond balls are approximately 0.65 millimeters apart. Row 61 of outer mesh bond balls and row 62 of inner signal bond balls are approximately 1.3 millimeters apart. Row 63 of surface-mount blocking elements, including surface-mount blocking elements 65, 66, and 67, are located between row 61 of outer mesh bond balls and row 62 of inner signal bond balls. Each of the surface-mount blocking elements 65, 66, and 67 has a cross-sectional rectangular shape with a length of approximately 0.6 millimeters and a width of approximately 0.3 millimeters. As illustrated in FIG. 4A, a very thin (for instance, a size of 0.1 millimeters) insulated magnet wire 64 is used to probe an inner signal bond ball 73. Magnet wire 64 extends from a side edge 68 of POP security module 20, through the space between outer mesh bond balls 81 and 82, and through the space between outer mesh bond balls 83 and 84. Magnet wire 64 is blocked by surface-mount blocking element 66 and does not extend to reach inner signal bond ball 73. By disposing surface-mount blocking elements 65-67 between rows 60-61 of outer mesh bond balls and row 62 of inner signal bond balls, surface-mount blocking elements 65-67 become an additional physical barrier that prevents wire insertion. It is therefore much more difficult for a possible attacker to probe the inner signal bond balls and gain unauthorized access to sensitive information.

There are several advantages in utilizing surface-mount blocking elements to provide extra protection for inner signal bond balls. First, the length of surface-mount blocking element 66 is made longer than the diameter of a mesh bond ball and therefore provides a better physical barrier as compared to a mesh bond ball. Second, surface-mount blocking element 66 can be either a passive component or an active component such as a capacitor or a resistor. Typically, integrated circuit die 23 or 43 of POP security module 20 requires some discrete components outside the IC die, and those discrete components may also be utilized as surface-mount blocking elements for the purpose of providing extra physical barrier against wire insertion. Finally, by arranging surface-mount blocking elements properly, inner signal bond balls can be selectively protected. In the example of FIG. 4, inner signal balls of row 62 carry sensitive data and needs extra protection. Row 63 of surface-mount blocking elements is therefore selectively disposed next to row 62 of inner signal bond balls. On the other hand, row 85 of inner signal bond balls is only protected by the pair of rows 86-87 of outer mesh bond balls. There are no additional surface-mount blocking elements disposed next to row 85 of inner signal bond balls.

Figure 5:
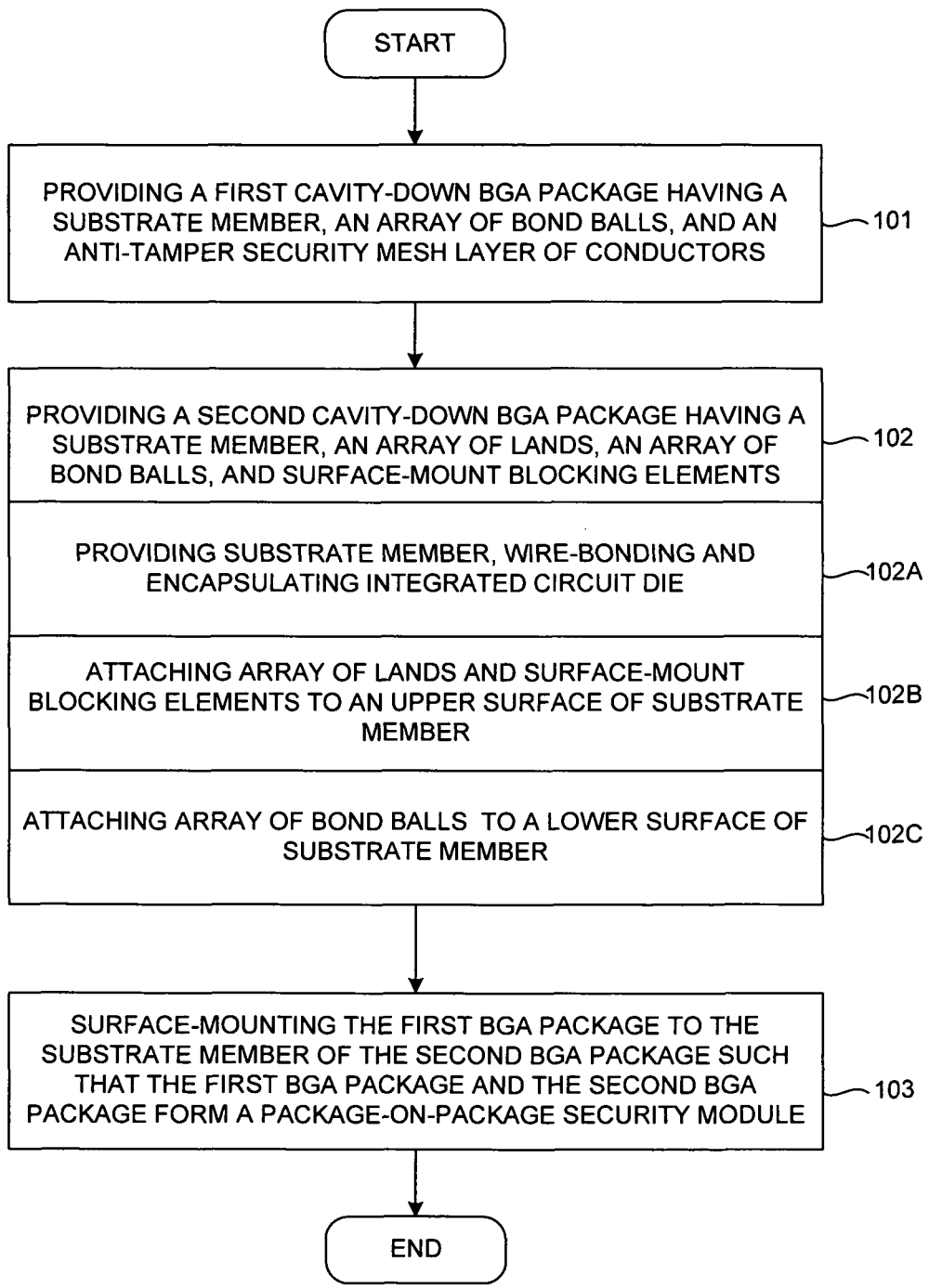
FIG. 5 is a flow chart that illustrates a method of manufacturing POP security module 20 in accordance with one novel aspect.

FIG. 5 is a flow chart that illustrates a method of manufacturing POP security module 20 in accordance with one novel aspect. FIGS. 6-10 are simplified cross-sectional diagrams that correspond to the method of manufacturing POP security module 20 of FIG. 5.

Figure 6:
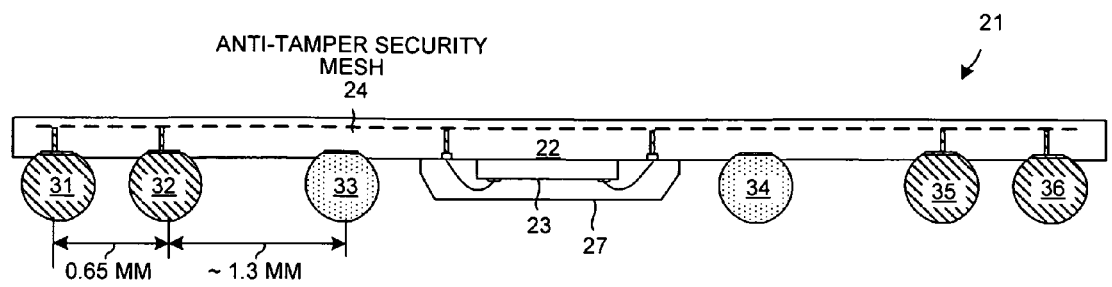
FIGS. 6-10 are simplified cross-sectional diagrams that correspond to the method of manufacturing POP security module 20 of FIG. 5.

In step 101, top BGA package 21 is manufactured. First, substrate member 22 is provided. Anti-tamper security mesh 24 is embedded within substrate member 22. Second, integrated circuit die 23 is wire bonded to a lower surface of substrate member 22. Integrated circuit 23 is then encapsulated with block of encapsulant 27. Finally, an array of bond balls including bond balls 31-36 are attached to the lower surface of substrate member 22. FIG. 6 is a simplified cross-sectional diagram of BGA package 21. As illustrated in FIG. 6, bond balls 31-32 and 35-36 are outer mesh bond balls coupled to anti-tamper security mesh 24 and bond balls 33-34 are inner signal bond balls. The distance between outer mesh bond ball 32 and inner signal bond ball 33 is longer than the distance between two outer mesh bond balls of 31 and 32. Similarly, the distance between outer mesh bond ball 35 and inner signal bond ball 34 is also longer than the distance between two outer mesh bond balls of 35 and 36. In one example, each outer mesh bond ball has a size of approximately 0.45 millimeters and is approximately 0.65 millimeters apart from each other. However, the distance between mesh bond ball 32 and signal bond ball 33 is approximately 1.3 millimeters.

Figure 7:
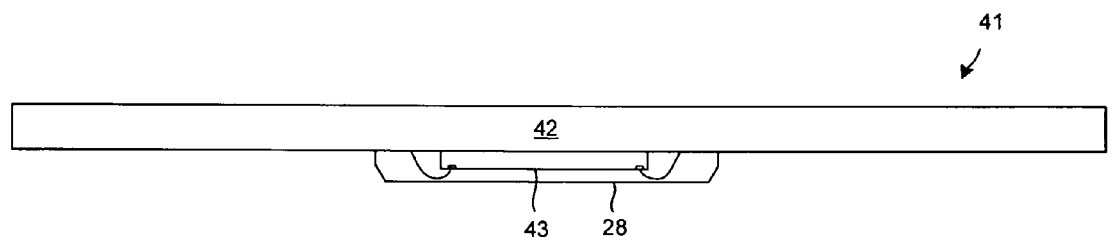

In step 102, bottom BGA package 41 is manufactured. In step 102A, substrate member 42 is provided. Integrated circuit die 43 is then wire bonded to a lower surface of substrate member 42 and encapsulated with block of encapsulant 28. FIG. 7 is a simplified cross-sectional diagram of a part of BGA package 41 having substrate member 42 and integrated circuit die 43.

Figure 8:
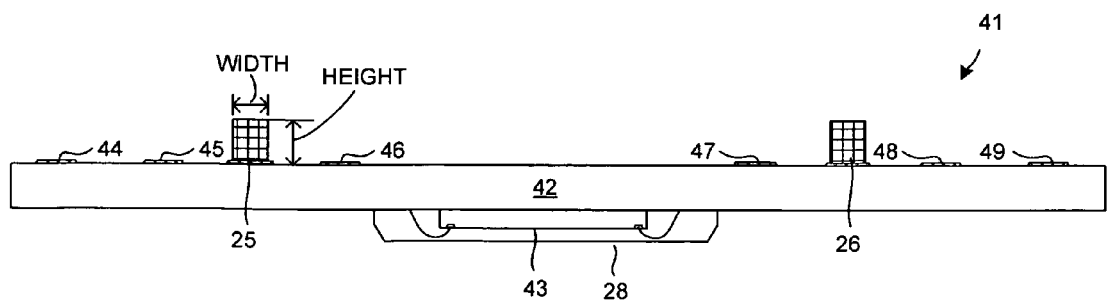

In step 102B, an array of lands including lands 44-49 are attached to an upper surface of substrate member 42. Surface-mount blocking elements 25 and 26 are also attached to the upper surface of substrate member 42. FIG. 8 is a simplified cross-sectional diagram of a part of BGA package 41 having substrate member 42, integrated circuit die 43, array of lands 44-49, and surface-mount blocking elements 25 and 26. In one example, surface-mount blocking elements 25 and 26 have a height of about 0.3 millimeters and a width of about 0.3 millimeters.

Figure 9:
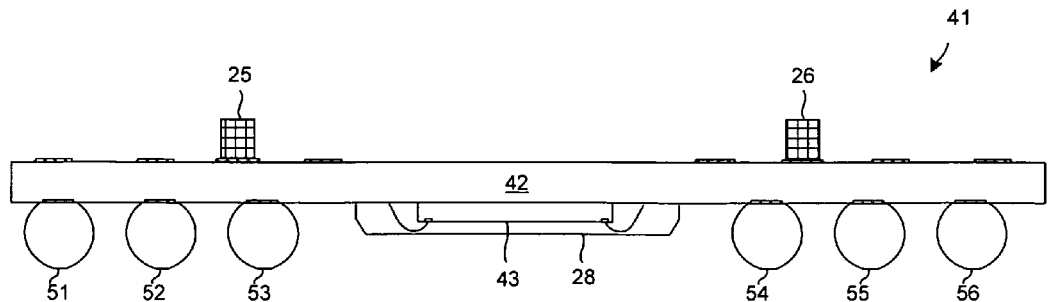

In Step 102C, array of bond balls including bond balls 51-56 are attached to a lower surface of substrate member 42. FIG. 9 is a simplified diagram of bottom BGA package 41.

Figure 10:
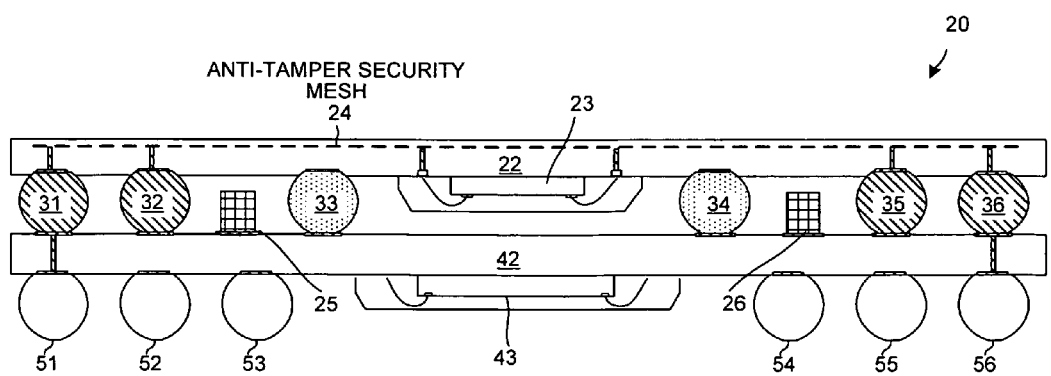

In step 103, bond balls 31-36 of top BGA package 21 register with and are fixed to corresponding ones of the lands 44-49 on the upper surface of substrate member 42 of bottom BGA package 41. Top BGA package 21 is therefore piggy-back mounted to bottom BGA package 41 to form a package-on-package (POP) security module 20. FIG. 10 is a simplified diagram of POP security module 20. As illustrated in FIG. 10, because the distance between outer mesh bond ball 32 and inner signal bond ball 33 is longer (for instance, about 1.3 millimeters as illustrated in FIG. 6), there is enough space for surface-mount blocking element 25 (for instance, surface-mount blocking element 25 has a width of about 0.3 millimeters as illustrated in FIG. 8) to be disposed in between outer mesh bond ball 32 and inner signal bond ball 33. Similarly, there is enough space for surface-mount blocking element 26 to be disposed in between outer mesh bond ball 35 and inner signal bond ball 34. In addition, the height of surface-mount blocking elements 25 and 26 is selected to be smaller than the size of the bond balls to provide clearance, but large enough to provide blocking capability (for instance, surface-mount blocking element 25 has a height of about 0.3 millimeters as illustrated in FIG. 8, and each bond ball has a diameter of about 0.45 millimeters as illustrated in FIG. 6).

Figure 11:
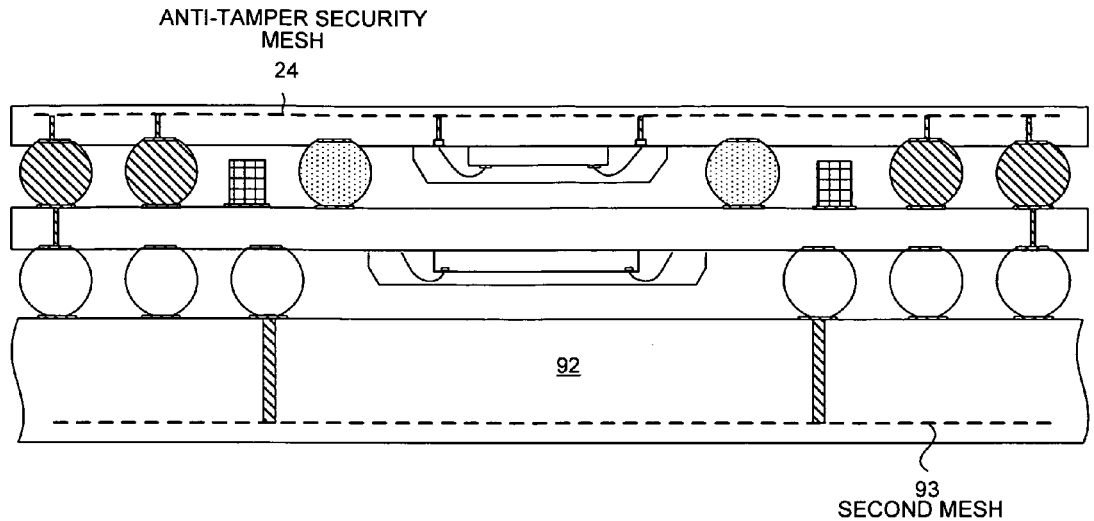
FIG. 11 is a simplified cross-sectional view of POP security module 20 that is disposed on a printed circuit board.

FIG. 11 is a simplified cross-sectional diagram of POP security module 20 that is disposed on a printed circuit board 92. In the example of FIG. 11, a second anti-tamper security mesh 93 is embedded within and extends laterally through printed circuit board 92.

Figure 12:
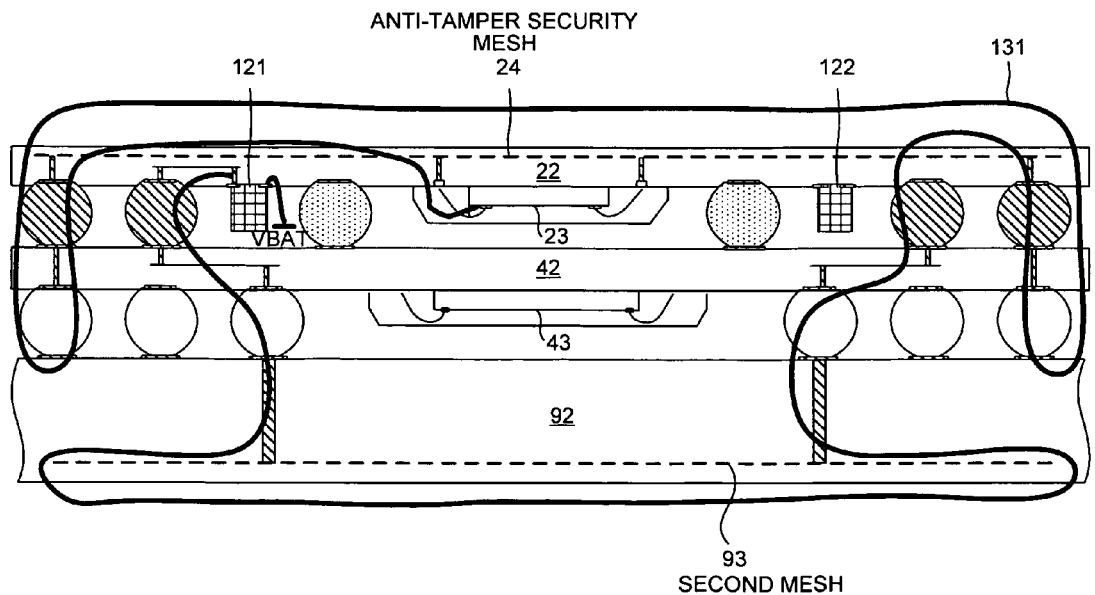
FIG. 12 is a simplified cross-sectional view of POP security module 20 that illustrates the use of a surface-mount blocking element to terminate an anti-tamper security mesh.

FIG. 12 is a simplified cross-sectional view of POP security module 20 that illustrates the use of a surface-mount blocking element 121 to terminate anti-tamper security mesh 24 and mesh 93. In the example of FIG. 12, surface-mount blocking element 121 is a discrete resistor attached to the lower surface of substrate member 22. Integrated circuit 23 is coupled to a first terminal of resistor 121 by a conductive path. The conductive path is illustrated by heavy line 131. The conductive path extends from integrated circuit 23 to first mesh 24, second mesh 93, and then to the first terminal of resistor 121. A supply voltage VBAT is present on a second terminal of resistor 121.

Figure 13:
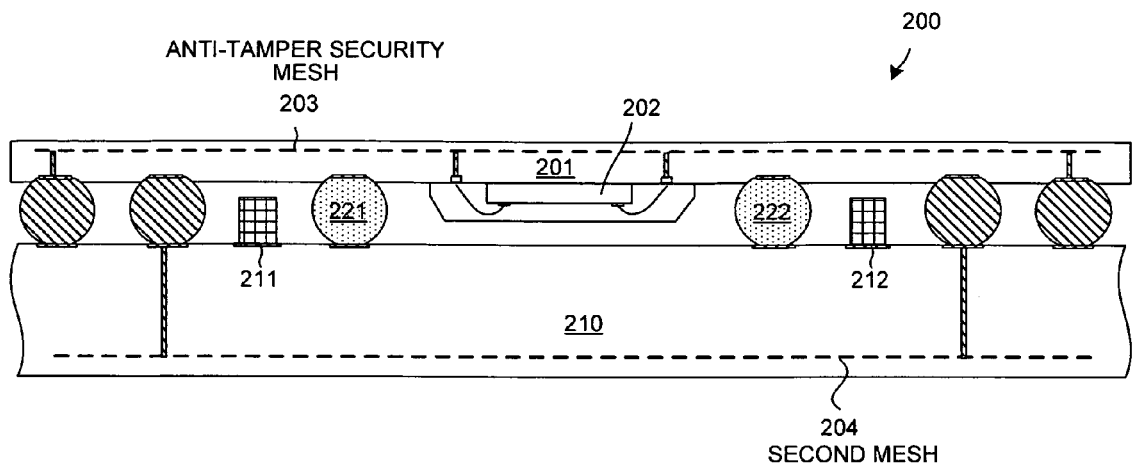
FIG. 13 is a cross-sectional view of a cavity-down BGA package 200 disposed on a printed circuit board in accordance with a novel aspect.

In a BGA package other than a POP security module, surface-mount blocking elements may also be utilized to provide extra protection for inner signal bond balls of the BGA package. FIG. 13 is a cross-sectional view of a cavity-down BGA package 200 disposed on a printed circuit board 210 in accordance with a novel aspect. BGA package 200 includes a substrate member 201, an integrated circuit die 202, and an array of bond balls that are disposed to a lower surface of substrate member 201. A first anti-tamper security mesh 203 is embedded within substrate member 201, and a second anti-tamper security mesh 204 is embedded within printed circuit board 210. In the example of FIG. 13, surface-mount blocking elements 211 and 212 are disposed on an upper surface of printed circuit board 210. Inner bond balls 221 and 222 are thus provided with extra protection against wire insertion from the side edges of BGA package 200.

Figure 14:
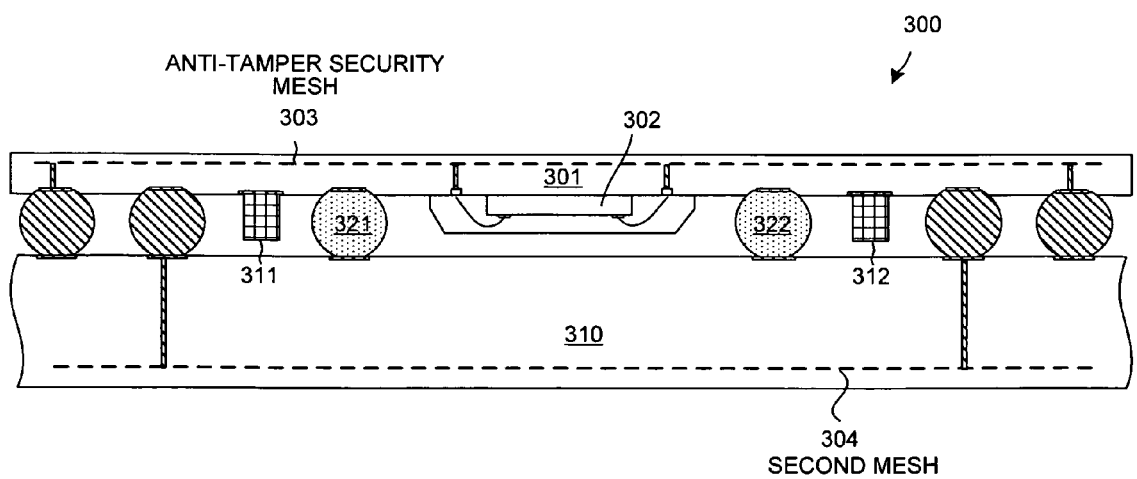
FIG. 14 is a cross-sectional view of a cavity-down BGA package 300 disposed on a printed circuit board in accordance with a novel aspect.

FIG. 14 is a cross-sectional view of a cavity-down BGA package 300 disposed on printed circuit board 310 in accordance with a novel aspect. BGA package 300 includes a substrate member 301, an integrated circuit die 302, and an array of bond balls that are disposed to a lower surface of substrate member 301. A first anti-tamper security mesh 303 is embedded within substrate member 301, and a second anti-tamper security mesh 304 is embedded within printed circuit board 310. In the example of FIG. 14, surface-mount blocking elements 311 and 312 are disposed on a lower surface of substrate member 301. Inner bond balls 321 and 322 are thus provided with extra protection against wire insertion from the side edges of BGA package 300.

Although certain specific exemplary embodiments are described above in order to illustrate the invention, the invention is not limited to the specific embodiments. Accordingly, various modifications, adaptations, and combinations of various features of the described embodiments can be practiced without departing from the scope of the invention as set forth in the claims.

What is claimed is:

1. An apparatus comprising:
a first cavity-down ball grid array (BGA) package having a substrate member and an array of bond balls, wherein the array of bond balls includes a pair of parallel extending rows of outer mesh bond balls and a row of inner signal bond balls that is parallel to the pair of rows of outer mesh bond balls, wherein each of the bond balls has a diameter, and wherein the distance between the row of inner signal bond balls and the pair of rows of outer mesh bond balls is less than five times the diameter of the bond balls; and
a surface-mount blocking element, wherein the surface-mount blocking element is a discrete electronic component disposed only between the pair of rows of outer mesh bond balls and the row of inner signal bond balls to protect against unauthorized access to the inner signal bond balls.

2. The apparatus of claim 1, further comprising:
a second substrate member, wherein the surface-mount blocking element and the first BGA package are surface mounted to the second substrate member.

3. The apparatus of claim 1, further comprising:
a second cavity-down BGA package having a substrate member, wherein the surface-mount blocking element and the first BGA package are surface mounted to the substrate member of the second BGA package.

4. The apparatus of claim 3, wherein an integrated circuit of the first BGA package communicates security data to an integrated circuit of the second BGA package through one of the inner signal bond balls.

5. The apparatus of claim 1, wherein the surface-mount blocking element is taking from the group consisting of: an active component, and a passive component.

6. The apparatus of claim 1, wherein the surface-mount blocking elements has a cross-sectional rectangular shape having a length and a width, wherein the length extends in parallel to the row of inner signal bond balls, and wherein the length is longer than the diameter of the bond balls.

7. The apparatus of claim 6, wherein the surface-mount blocking element has a height that is larger than half of the diameter of the bond balls.

8. The apparatus of claim 1, wherein the substrate member of the first BGA package comprises an anti-tamper security mesh of conductors, and wherein a conductor of the anti-tamper security mesh is coupled to an integrated circuit of the first BGA package through one of the outer mesh bond balls.

9. The apparatus of claim 8, wherein the surface-mount blocking element is a termination resistor for the anti-tamper security mesh.

10. An apparatus, comprising:
a cavity-down Ball Grid Array (BGA) package having an outer boundary, a substrate member, a pair of parallel extending rows of outer mesh bond balls and a row of inner signal bond balls that is parallel to the pair of tows of outer mesh bond balls; and
means for blocking access to the row of inner signal bond balls from the outer boundary, wherein the means comprises a discrete electronic component that is only located between the pair of rows of outer mesh bond balls and the row of inner signal bond balls to protect against unauthorized access to the inner signal bond balls.

11. The apparatus of claim 10, wherein the means includes a surface mount blocking element.

12. The apparatus of claim 11, wherein the surface-mount blocking element is attached to the substrate member of the BGA package.

13. The apparatus of claim 11, wherein the BGA package is surface mounted to a printed circuit board, and wherein the surface-mount blocking element is also surface mounted to the printed circuit board.

14. The apparatus of claim 1, wherein the substrate member of the first BGA package comprises an anti-tamper security mesh of conductors, and wherein the surface-mount blocking element is used to terminate the anti-tamper security mesh of conductors.

15. The apparatus of claim 1, wherein the substrate member of the first BGA package comprises an anti-tamper security mesh of conductors, wherein the surface-mount blocking element is a discrete resistor with a first terminal and a second terminal, wherein the first terminal is coupled to the anti-tamper security mesh of conductors, and wherein the second terminal is couple to a supply voltage.

16. The apparatus of claim 1, wherein the first BGA package is surface mounted to a printed circuit board, and wherein the surface-mount blocking element is also surface mounted to the printed circuit board.

17. The apparatus of claim 1, where the surface-mount blocking element is a capacitor.

18. The apparatus of claim 10, wherein the substrate member of the BGA package comprises an anti-tamper security mesh of conductors.

19. The apparatus of claim 10, wherein an integrated circuit of the BGA package communicates security data through one of the inner signal bond balls.

20. The apparatus of claim 10, wherein the substrate member of the BGA package comprises an anti-tamper security mesh of conductors, wherein the means has a first terminal and a second terminal, wherein the first terminal is coupled to the anti-tamper security mesh of conductors, and wherein the second terminal is coupled to a supply voltage.

\* \* \* \* \*